US006965245B2

(12) United States Patent
Kister et al.

(10) Patent No.: US 6,965,245 B2
(45) Date of Patent: Nov. 15, 2005

(54) PREFABRICATED AND ATTACHED INTERCONNECT STRUCTURE

(75) Inventors: January Kister, Portola Valley, CA (US); David Beatson, Kenneth Square, PA (US); Edward Laurent, North Wales, PA (US)

(73) Assignee: K&S Interconnect, Inc., Wilmington, DE (US)

( * ) Notice: Subject to any disclaimer, the term of this patent is extended or adjusted under 35 U.S.C. 154(b) by 0 days.

(21) Appl. No.: 10/429,275

(22) Filed: May 1, 2003

(65) Prior Publication Data

US 2004/0217768 A1  Nov. 4, 2004

(51) Int. Cl.⁷ .......................... G01R 31/02; H01R 12/00
(52) U.S. Cl. ....................................... 324/755; 324/754
(58) Field of Search ............ 324/754–762; 439/65–85; 29/825, 854, 829–836, 842

(56) References Cited

U.S. PATENT DOCUMENTS

| | | | |
|---|---|---|---|
| 5,152,695 A * | 10/1992 | Grabbe et al. ................. 439/71 |
| 5,173,055 A * | 12/1992 | Grabbe ......................... 439/66 |
| 5,210,939 A | 5/1993 | Mallik et al. | |
| 5,223,741 A * | 6/1993 | Bechtel et al. ............... 257/678 |
| 5,604,330 A | 2/1997 | Hasan et al. ................ 174/52.4 |
| 5,644,249 A * | 7/1997 | Kister ........................... 324/762 |
| 5,672,548 A * | 9/1997 | Culnane et al. ............. 438/118 |
| 5,900,738 A | 5/1999 | Khandros et al. ............ 324/761 |
| 5,917,707 A | 6/1999 | Khandros et al. ........... 361/776 |
| 5,923,090 A | 7/1999 | Fallon et al. ................. 257/777 |
| 5,934,914 A * | 8/1999 | Fjelstad et al. ................ 439/82 |
| 5,994,152 A | 11/1999 | Khandros et al. ............ 436/617 |
| 6,023,103 A | 2/2000 | Chang et al. ................. 257/781 |
| 6,029,344 A | 2/2000 | Khandros et al. ............. 29/874 |
| 6,049,976 A | 4/2000 | Khandros ..................... 29/843 |
| 6,050,829 A | 4/2000 | Eldridge et al. ............... 439/67 |
| 6,124,546 A | 9/2000 | Hayward et al. .......... 174/52.2 |
| 6,168,974 B1 | 1/2001 | Chang et al. ................ 438/109 |
| 6,184,053 B1 | 2/2001 | Eldridge et al. ............... 438/52 |
| 6,184,587 B1 | 2/2001 | Khandros et al. ........... 257/784 |
| 6,215,196 B1 | 4/2001 | Eldridge et al. ............. 257/784 |
| 6,215,670 B1 | 4/2001 | Khandros ..................... 361/774 |
| 6,232,149 B1 | 5/2001 | Dozier, II et al. ........... 438/117 |
| 6,242,803 B1 | 6/2001 | Khandros et al. ........... 257/750 |
| 6,268,015 B1 | 7/2001 | Mathieu et al. ............... 427/96 |
| 6,330,164 B1 | 12/2001 | Khandros et al. ............ 361/760 |
| 6,354,868 B1 * | 3/2002 | Korczynski et al. ......... 439/516 |
| 6,441,315 B1 | 8/2002 | Eldridge et al. ............. 174/260 |
| 6,475,822 B2 | 11/2002 | Eldridge et al. ............. 438/526 |
| 6,476,333 B1 | 11/2002 | Khandros et al. ........... 174/267 |
| 6,482,013 B2 | 11/2002 | Eldridge et al. ............... 439/66 |

(Continued)

*Primary Examiner*—Paresh Patel
(74) *Attorney, Agent, or Firm*—Drinker Biddle & Reath LLP

(57) ABSTRACT

A interconnect assembly features a prefabricated interconnect structure metallurgically bonded to a terminal of a larger structure. Fabrication of the interconnect structure's independently and seperate from the larger structure enables the use of economic mass fabrication techniques that are well-known for miniature scale sheet metal parts. During fabrication, positioning and attachment, each interconnect structure is combined with and/or held in a carrier structure from which it is separated after attachment to the terminal. The interconnect structure is configured such that an attachment tool may be brought into close proximity to the attachment interface between the interconnect structure and the terminal for a short and direct transmission of bonding energy onto the attachment interface. The attachment interface provides for an electrically conductive and a bending stress opposing mechanical connection between the interconnect structure and the terminal. The interconnect assembly is preferably part of a probe apparatus.

35 Claims, 14 Drawing Sheets

U.S. PATENT DOCUMENTS

| | | | |
|---|---|---|---|
| 6,483,328 B1 | 11/2002 | Eldridge et al. | 427/96 |
| 6,491,968 B1 | 12/2002 | Mathieu et al. | 427/96 |
| 6,497,581 B2 * | 12/2002 | Slocum et al. | 439/66 |
| 6,520,778 B1 | 2/2003 | Eldridge et al. | 439/66 |
| 6,532,654 B2 * | 3/2003 | Guerin et al. | 29/884 |
| 6,538,214 B2 | 3/2003 | Khandros | 174/267 |
| 6,539,531 B2 | 3/2003 | Miller et al. | 716/15 |
| 6,669,489 B1 * | 12/2003 | Dozier, II et al. | 439/71 |
| 2001/0002341 A1 | 5/2001 | Eldridge et al. | 439/66 |
| 2001/0038030 A1 | 11/2001 | Khandros et al. | 228/155 |
| 2002/0117330 A1 | 8/2002 | Eldridge | 174/260 |
| 2002/0145032 A1 | 10/2002 | Khandros et al. | 228/155 |
| 2003/0010976 A1 | 1/2003 | Grube et al. | 257/48 |
| 2003/0015347 A1 | 1/2003 | Eldridge et al. | 174/260 |
| 2003/0057975 A1 | 3/2003 | Eslamy et al. | 324/754 |
| 2003/0062398 A1 | 4/2003 | Khandros | 228/112.1 |

\* cited by examiner

PREFABRICATED AND ATTACHED INTERCONNECT STRUCTURE

FIELD OF INVENTION

The present invention relates to interconnect structures for conductively contacting terminals. Particularly, the present invention relates to interconnect structures of a probe apparatus for testing semiconductor devices.

BACKGROUND OF INVENTION

A conventional probe apparatus for testing semiconductor devices includes a number of interconnect structures for temporarily contacting test terminals of the tested device. As the semiconductor technology advances, the tested devices become increasingly smaller while the number of simultaneously accessed terminals continues to increase. At the same time, commercial competition forces the industry to provide semiconductor testing at ever decreasing cost. To meet these demands, there exists a need for further improvement of probe apparatus.

A crucial component in a probe apparatus are the interconnect structures that are tightly arrayed within a probe apparatus. The interconnect structures are configured for a reliable electrical contacting during a high number of test cycles. With advancement of semiconductors, interconnect structures become increasingly smaller and tighter arrayed.

Interconnect structures need to meet several functional criteria. Firstly, they need to be sufficiently flexible and resilient to compensate for positioning discrepancies of test terminals. Secondly, the interconnect structures needs to scratch along the terminal's surface to remove any eventual insulating oxides and films prior to establishing a conductive contact to the test terminals. This scratching also known in the art as scribing is accomplished by endowing the interconnect structure with an elastic deformation characteristic that results in a relative motion of the interconnect's end along the test terminal's surface during an initial positioning. Thirdly, the interconnect structures must be simple in shape and configuration to be cost effectively fabricated in high numbers. Fourthly, the interconnect structures need to be configured for a cost effective assembly in ever increasing numbers and tighter spacing.

In the prior art, two main designs for interconnect structures have been implemented to address the needs stated above. According to a first design interconnect structures are fabricated as well-known buckling beams made of wire having a round and/or rectangular cross section. Buckling beams are oriented in a certain manner with respect to the tested terminals such that they buckle upon initial contact with the test terminals. The resilient buckling of the beams provides for suspension and scribing. Unfortunately, the buckling beams need to be held at both ends with sufficient lateral space to permit buckling in the middle of the buckling beams. This results in a relative complicate and cost intensive assembly.

In a second design concept, the interconnect structures are fabricated as spring like features directly on a face of a larger structure of the probe apparatus with which they are rigidly connected. Such larger structure may include a well-known space transformer and/or a well-known printed circuit board [PCB] transformer. During the contacting with the test terminal, the resilient deflection of the interconnect structures is opposed by the larger structure on which the interconnect structures are fabricated and with which they are rigidly connected.

The advantage of the second design concept is that the interconnect structures need not be held on both ends as is required for the buckling beam probes. Unfortunately, the effort for fabricating spring like interconnect structures directly on the face of a larger structure is relatively high. This is, because for a required contact force between the interconnect structure and the test terminal, the spring type interconnect needs to have a structural strength that is significantly higher than that of a buckling beam. Also, since the deflection of each spring like structure is opposed by the larger structure, each interface between the two of them may be exposed to high stresses. As a result, the interface may need additional structural support. In the prior art, complicated fabrication steps are performed for fabricating spring like interconnect structures. Such fabrication steps include multiple layer depositions and multiple layer shaping operations.

In the prior art, several problems associated with the fabrication of small scale interconnect structures directly on the face of a larger structure remain unresolved. One problem is to position and transport the miniature structure during its fabrication. A second problem is to precisely position an eventually pre-fabricated structure in its final assembly position on a larger structure. A third problem is to attach the eventually pre-fabricated structure in its final assembly position. The attachment is particularly problematic, where stresses are at a maximum in the attachment interface. The present invention addresses these problems.

SUMMARY

An interconnect assembly combines prefabricated interconnect structures that are attached on terminals of a larger structure. The interconnect assembly is preferably part of a probe apparatus for testing semiconductor devices.

The interconnect structures are prefabricated preferably from sheet metal. The interconnect structures feature an attachment face with which they are attached to the terminals. The attachment face is part of a base, which also features an access face in close proximity and substantially opposing the attachment face.

The attachment is accomplished by a separate attachment tool that is brought into contact with the access face through which a bonding energy is excerpted onto the base. The bonding energy is transmitted through the base towards the interface between attachment face and terminal. As a result of the bonding energy, a metallurgical bonding takes place between the terminal and the attachment face. Bonding energy may be excerpted in the well-known forms of thermal, electrical and/or mechanical energy. The metallurgical bonding includes soldering, brazing or welding.

Laterally protruding from the base is a suspension element with a contacting end on its distal end. The contacting end is configured for an eventual removing of an eventual oxide layer on top of the contact terminal—well-known as scribing. The contacting end is also configured for establishing a conductive contact with the contact terminal while the contacting end is forced against the contact terminal by a spring force of the suspension element.

The suspension element has a predetermined bending characteristic, which provides for the spring force and the scribing movement on a contact terminal during initial positioning movement of the interconnect assembly relative to the contact terminal.

During initial fabrication of the interconnect structure prior and during its attachment to the larger structure's terminal, the interconnect structure is combined and held in a carrier structure. The carrier structure and the interconnect structures are preferably of monolithic sheet metal. Once the attachment is completed, the interconnect structure is separated from the carrier structure in a well-known fashion.

Various techniques may be utilized for fabricating the interconnect structures. Such fabrication techniques may include, photolithographic etching, stamping, bending, forging, plating, laser machining, electric discharge machining, electron beam machining, surface treating, and heat-treating. The interconnect structures may be arranged on the carrier structure for a multiple simultaneous attachment or for a sequential attachment to a number of attachment terminals.

The attachment interface between terminal and attachment face may be configured substantially independently from other dimensional constrains like, for example, the suspension element's shape and/or the suspension elements bending characteristic. This is particularly advantageous for configurations of the interconnect structure in which the spring force results in a high bending momentum within the attachment interface.

The suspension element may be configured to provide the spring force with substantially constant internal stress over its length. In such configuration and for a required spring force and suspension element material, a maximum deflection is provided with a minimum of suspension element length.

The suspension element may be further shaped in a backwards-looping fashion such that the contacting end and the attachment interface are substantially centered with respect to the spatial orientation of the spring force. In that fashion, bending momentum in the attachment face may be substantially eliminated.

The attachment terminals serve firstly to transmit electrical signals from conductive leads onto the interconnect structure. The attachment terminals serve secondly to transmit force and bending momentum that eventually result from the spring force onto the larger structure. For the second reason, the terminals may be embedded in the larger structure for an increased structural interlocking between the larger structure and the attachment terminal. The increased structural interlocking may reduce an eventual risk of delimitation between the attachment terminal and the larger structure.

The larger structure may be a well-known space transformer or a well-known printed circuit board [PCB] transformer of the probe apparatus. Interconnect structures may be also attached in different sizes and on opposing faces of a single space transformer.

DETAILED DESCRIPTION

Figure 1:
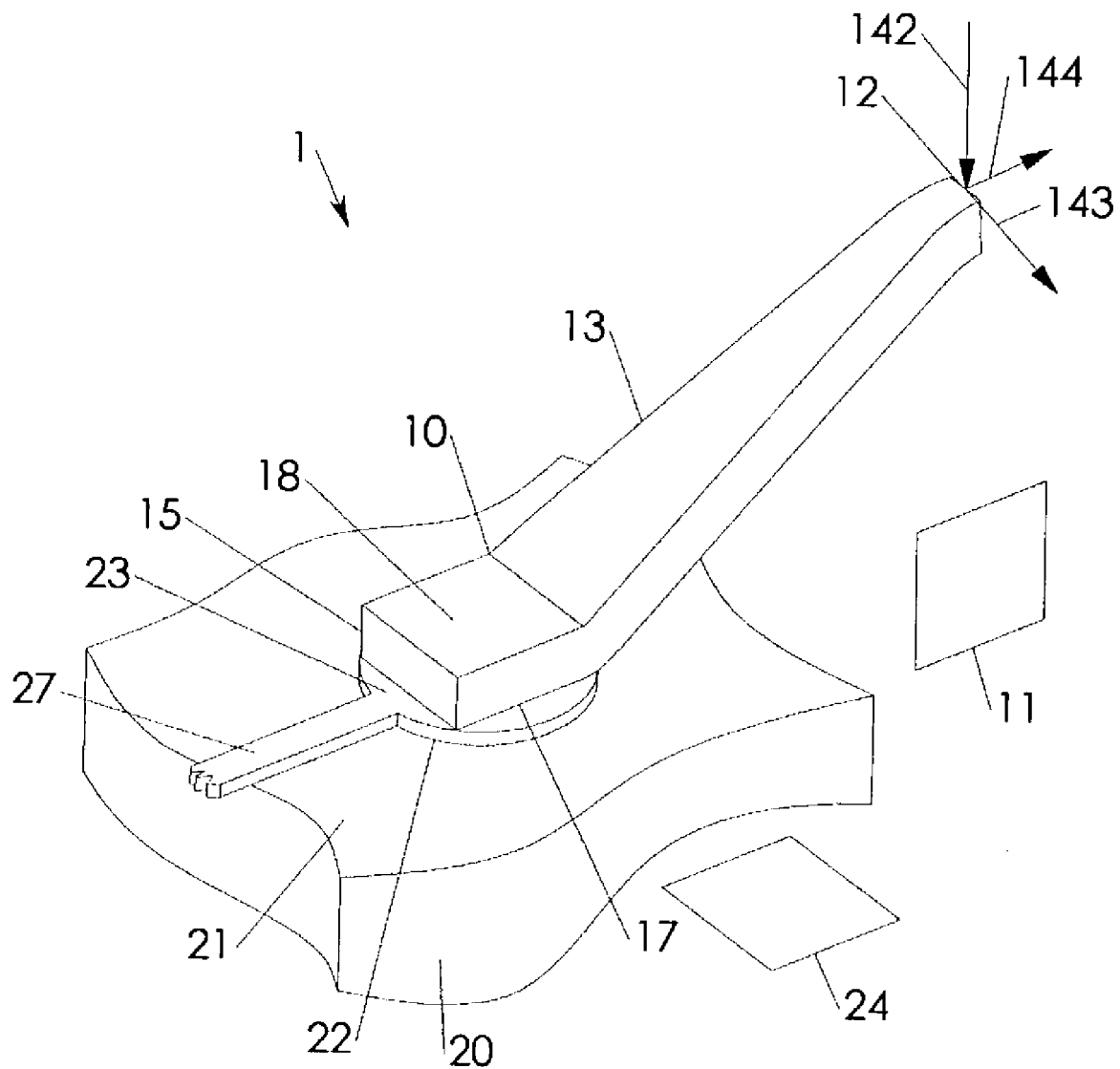
FIG. 1 shows a perspective view of a first embodiment interconnect assembly with a portion of a larger structure.

As shown in FIG. 1 and according to a first embodiment of the invention, an interconnect assembly 1 includes a prefabricated interconnect structure 10 attached to a conductive terminal 22 accessible on a face 21 of the larger structure 20. Prior to attachment, the interconnect structure 10 is prefabricated with an attachment base 15, a suspension element 13 and a contacting end 12. The attachment base 15 has an access face 18 and an attachment face 17 that substantially opposes the access face 18.

Rigid connection between the interconnect structure 10 and the attachment terminal 22 is provided by metallurgical bonding in an attachment interface between the attachment face 17 and a terminal face 23. Metallurgical bonding in context with the present invention includes soldering, brazing and welding. The metallurgical bonding provides a connection that is electrically conductive and structurally substantially rigid opposing at least a bending stress resulting in the attachment interface from an operational spring force at the contacting end 12. The metallurgical bonding may be established along the entire attachment interface or within region of the attachment interface.

The attachment interface may be defined in conjunction with well-known particularities of well-known attachment techniques and/or in conjunction with the forces resulting in the interface from the spring force to minimize stress within the regions as may be appreciated by anyone skilled in the art. In the exemplary case of utilizing laser energy as bonding energy for establishing a metallurgical bonding, the attachment interface may include a number of dot like weld points distributed in a suitable fashion between an attachment face 17, 117 (see FIG. 13) and a terminal face 22, 82 (see FIG. 8). In another exemplary case where sonic energy is utilized as bonding energy for establishing a metallurgical bonding, the attachment interface may include a friction weld area distributed between an attachment face 17, 117 and a terminal face 22, 82 in accordance with well-known particularities of sonic friction welding.

The suspension element 13 protrudes from the attachment base 15 adjacent the attachment face 17 and adjacent the access face 18 such that the attachment of the attachment face 17 to the terminal face 23 and an access to the access face 18 are substantially unimpeded. The suspension element 13 has a deformation characteristic resulting in a bending movement 143 in responds to a positioning movement 142 induced to the larger structure 20 relative to a contacting terminal 151, 162 (see FIG. 14) while the contacting end 12 is held in a fashion opposing the positioning movement 142. The bending movement translates into a well-known scribing movement 144 along the contacting terminal's 151, 162 surfaces and a spring force forcing the contacting end 12 towards the contacting terminals 151, 162.

The spring force in turn causes an internal bending stress along the suspension element 13 as is well-known in the mechanical arts. The suspension element 13 may be configured to provide the spring force with a substantially constant internal bending stress along its length between the base 15 and the contacting end 12. In such configuration and for a required spring force and suspension element material, a maximum deflection is provided with a minimum length of the suspension element 13. Constant internal stress may be accomplished by adjusting the cross section of the suspension element 13 along the length of the suspension element 13 as it is well appreciated in the art.

The main purpose of the interconnect structure 10 is to establish a conductive contact between the attachment terminal 22 and a contact terminal 151, 162. For that purpose, the contacting end 12 is configured for an eventual removing of an oxide layer form the contact terminals 151, 162 during the scribing. Configurations of the contacting end 12 may include a sharp edge, a pointed edge, an inverted V-shape terminating in a pointed edge, a tip protruding from a face, or the like. The contacting end 12 may be specially coated, solution treated and/or heat treated for an increased wear resistance and metal-to-metal electrical contact performance.

Figure 3:
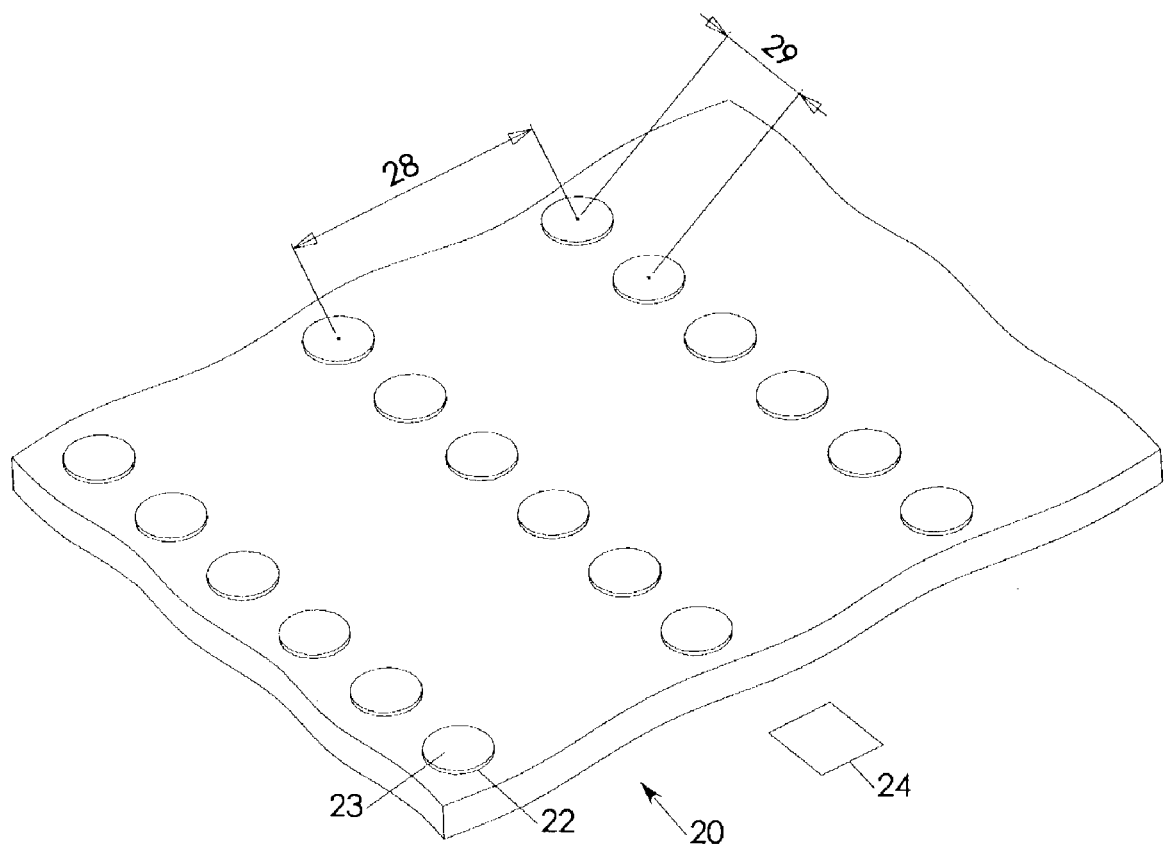
FIG. 3 depicts a perspective view of an extended portion of the larger structure in a first configuration.

The larger structure 20 extends substantially within a assembly plane 24 with a number of terminal faces 23 being preferably parallel and in plane with the assembly plane 24 (see also FIG. 3). At this point it is noted that in context with the present invention, the term "larger structure" defines any structure having at least one attachment terminal 22, 82 (see FIG. 8) and having an extension substantially larger than the extension of the attachment terminal 22, 82 within the attachment plane 24, 84 (see FIG. 8). The interconnect structure 10 is shaped preferably along a contour plane 11 that is preferably about perpendicular to the assembly plane 24. In the context of the present invention, the contour plane 11 is a plane perpendicular to the attach face 17 and parallel to the scribing movement 144. The suspension element 13 protrudes in an angle relative to the attachment face 17 such that sufficient clearance is maintained between the suspension element 13 on one side and the larger structure 20 and eventually adjacent interconnect structures 10 on the other side during operational resilient deformation of the suspension element 13 and the contacting end 12.

The terminal 22 may be conductively connected to a conductive lead 27 for communicating an electric signal towards and/or away from the interconnect structure 10. The conductive lead 27 may propagate within the larger structure 10 or on its face 21. In case the terminal 22 protrudes all through the larger structure 20, the conductive lead 27 may also be connected to the terminal 22 on an opposite face (not shown) of the larger structure 20.

Figure 2:
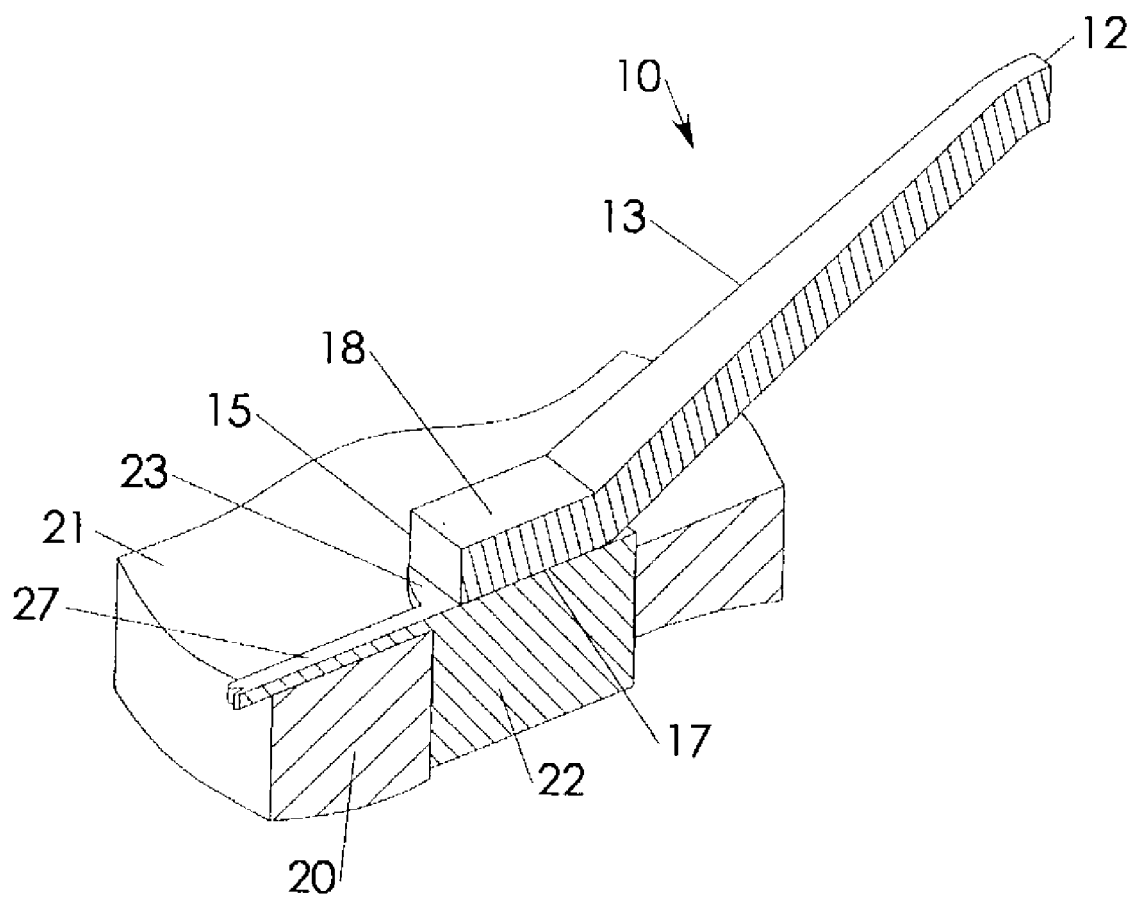
FIG. 2 illustrates the interconnect assembly of FIG. 1 in perspective cut view.

As shown in FIG. 2, the terminal 22 may be embedded in the larger structure 20 for an increased structural interlocking between the larger structure 20 and the attachment terminal 22. Forces and momentum eventually resulting from the spring force are thereby transmitted from the base 15 onto the larger structure 20 with a reduced risk of well-known delamination between the terminal 22 and the larger structure 20.

Figure 4:
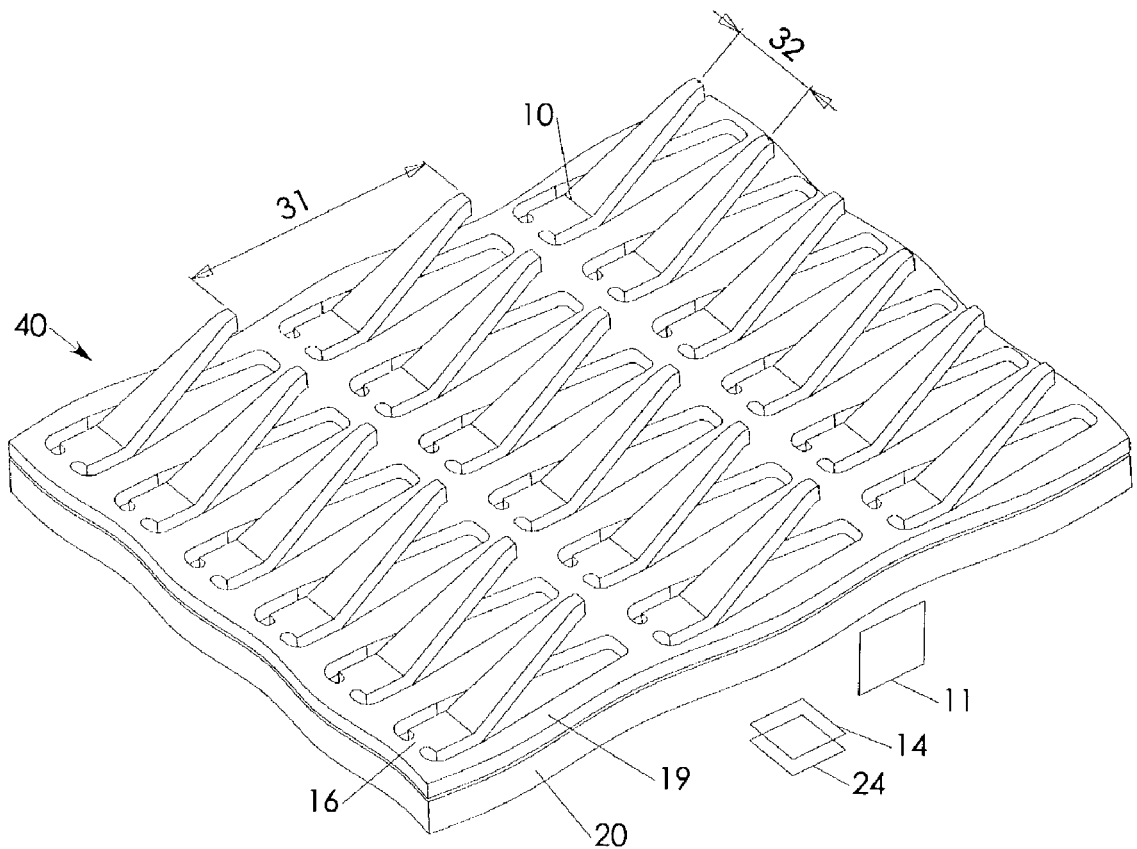
FIG. 4 shows a portion of a first carrier structure positioned on top of the larger structure of FIG. 3 for attachment of the interconnect structures held within the first carrier structure.
Figure 5:
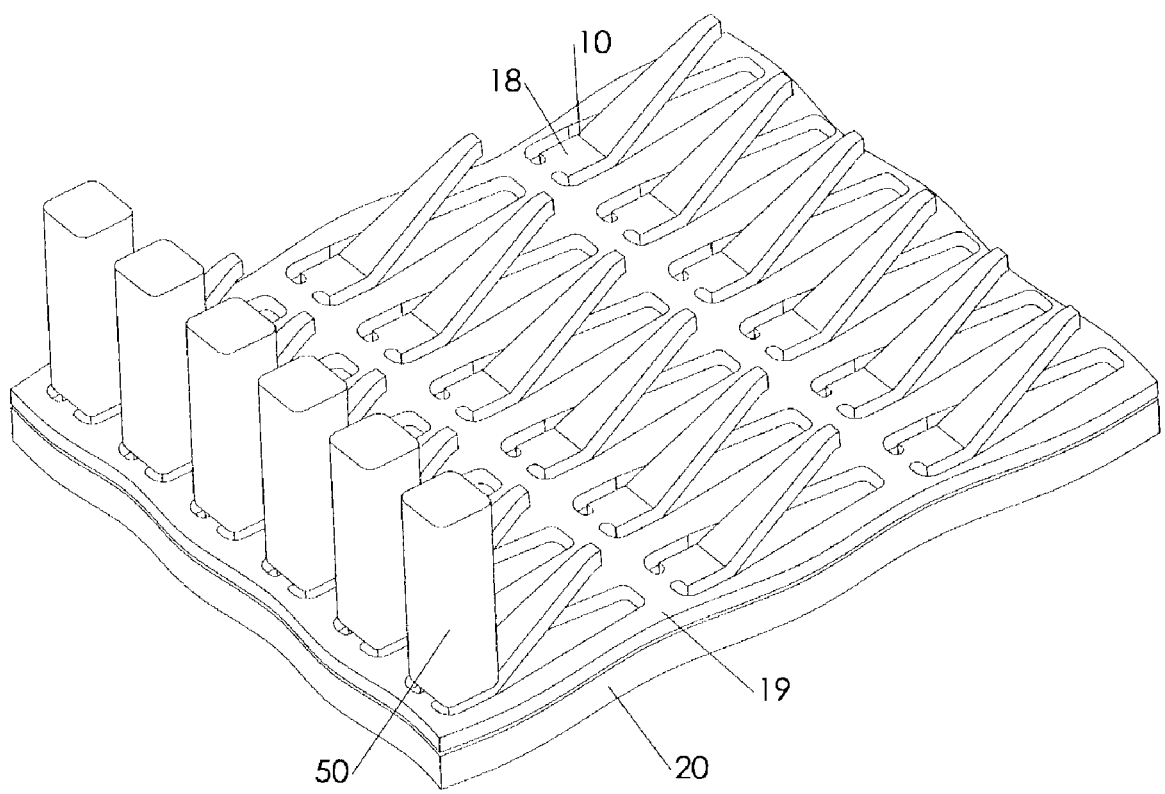
FIG. 5 illustrates the first carrier structure and larger structure of FIG. 3 during a fabrication step in which a first number of interconnect structures are attached to the carrier structure.

FIG. 3 depicts a perspective view of an extended portion of the larger structure 20 in a first configuration in which a dependent terminal spacing 28 and 29 are defined by a fabrication spacing 31 and 32, which will be explained in the following under FIG. 4. There, a portion of a first carrier structure 19 is positioned on top of the larger structure 10 as depicted in FIG. 3. Each of a number of interconnect structures 10 is connected to the first carrier structure 19 via a cutoff bridge 16.

The first carrier structure 19 may be positioned with respect to the larger structure 10 in a well-known fashion. For example, well-known reference holes (not shown) may be placed correspondingly in the larger structure 20 and the first carrier structure 19 such that well-known alignment pins (not shown) snuggly and perpendicularly protruding through the reference holes may align the first carrier structure 19 with respect to the larger structure 20. In aligned position, each attachment face 17 is placed adjacent and at least partially overlapping a terminal face 23. Each interconnect structure 10 is fabricated and held within the first carrier structure 19 such that each attachment face 17 is substantially in plane with a fabrication plane 14 of the first carrier structure 19. Hence, all interconnect structures 10 within the first carrier structure 19 may be brought simultaneous into attachment position by merely positioning the first carrier plate 19 with respect to the larger structure 20. For that purpose, the terminal spacing 28, 29 is selected in correspondence with the fabrication spacing 31, 32. In attachment position, assembly plane 24 and fabrication plane 14 are substantially parallel and substantially coincident.

The fabrication spacing 31, 32 is defined to provide sufficient separation for the fabrication steps of the individual interconnect structures 10. Fabrication steps of the interconnect structures 10 include a partial separation and contouring of an interconnect structure blank, shaping of the interconnect structure blank and eventual finishing operations. The fabrication spacing 31, 32 is further influenced by a required minimum stiffness of the first carrier structure 19. The minimum stiffness may be defined for handling the first carrier structure 19 between fabrication steps and/or for positioning the first carrier structure 19 onto the larger structure 20.

Partial separation may be accomplished with well-known techniques such as photolithographic etching, stamping, laser cutting, plasma cutting and the like. Shaping may be accomplished by well-known techniques such as bending, forging, deep-drawing and the like. Finishing operations may include coating, surface finishing, contour finishing, solution treatment, and heat treatment. Fabrication steps may be performed simultaneously and/or sequentially.

The simultaneously positioned interconnect structures 10 may be simultaneously attached by a number of attachment tools 50. In such case, the attachment tools 50 may be spaced apart in accordance with the spacing of the access faces 18 within the first carrier structure 19. Each attachment tool 50 is configured to excerpt a bonding energy via the access face 18 through the base 15 onto the attachment face 17 and the terminal face 23. The bonding energy is of well-known nature to cause a heating of and/or between the attachment face 17 and the terminal face 23 to a level, where metallurgical bonding in the interface between attachment face 17 and the terminal face 23 occurs. Bonding energy may include thermal energy, electrical energy and/or mechanical energy. Correspondingly, the attachment tool 50 may be part of a soldering apparatus, a laser welding apparatus, an electrical welding apparatus, or a friction welding apparatus. Soldering, bracing or welding may accomplish metallurgical bonding between the attachment face 17 and the terminal face 23. Metallurgical bonding may be further accomplished without use of an attachment tool like, for example with well-known fabrication techniques in which the terminal faces 23 and the attachment faces 17 are immersed in a liquid solder bath.

Figure 6:
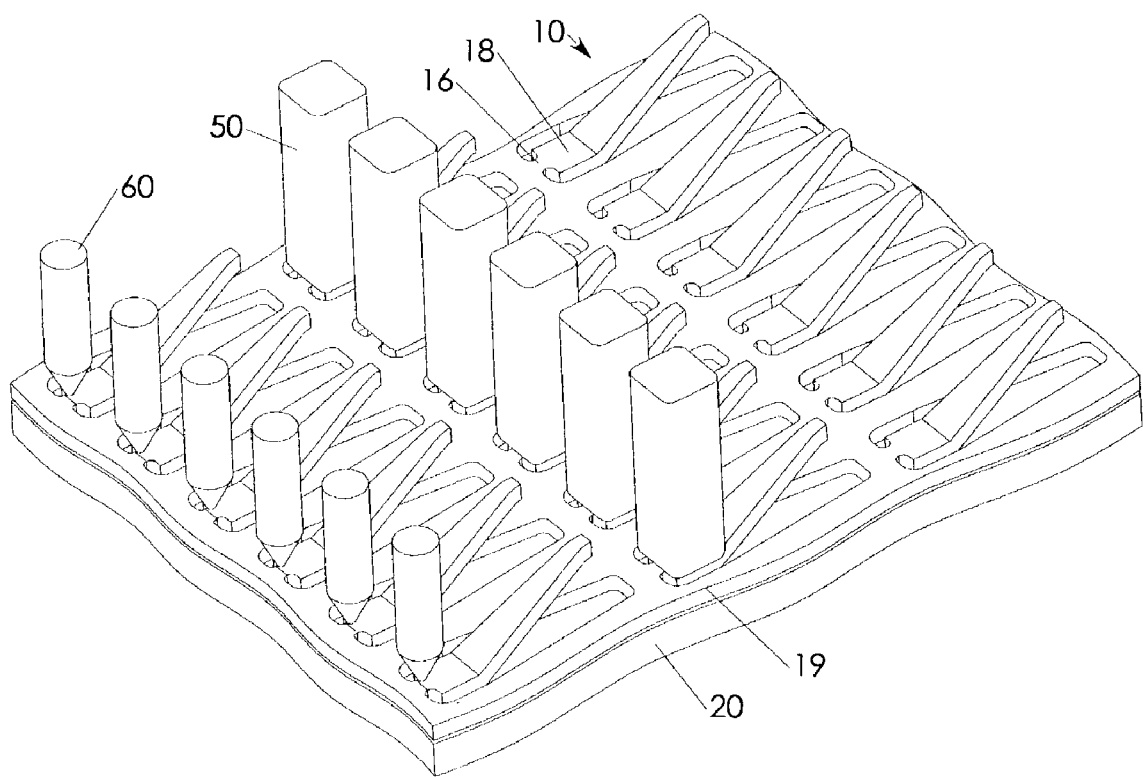
FIG. 6 depicts the first carrier structure and larger structure of FIG. 3 during a fabrication step in which the first number of interconnect structures are cut off the carrier structure while a second number of interconnect structures is attached to the carrier structure.

Following the attachment operation, the interconnect structures 10 may be separated from the first carrier structure 19. As illustrated in FIG. 6, a number of cutoff tools 60 may simultaneously cut through a number of cutoff bridges 16. Well-known electric pulse melting, laser cutting and so forth may accomplish the cutoff operation. The cutoff operation is preferably performed in a fashion that avoids or minimizes debris.

Separation may be further accomplished by temporarily fully separating the interconnect structure 10 from the first carrier structure 19 followed by press fitting the interconnect structure 10 back into a friction based fit within the first carrier structure 19. In that fashion, the interconnect structure 10 may be finally separated from the first carrier structure 10 by merely pressing it out of its press fit. The attachment tool 50 may be utilized for pressing the interconnect structure 10 out of its press fit.

Figure 7:
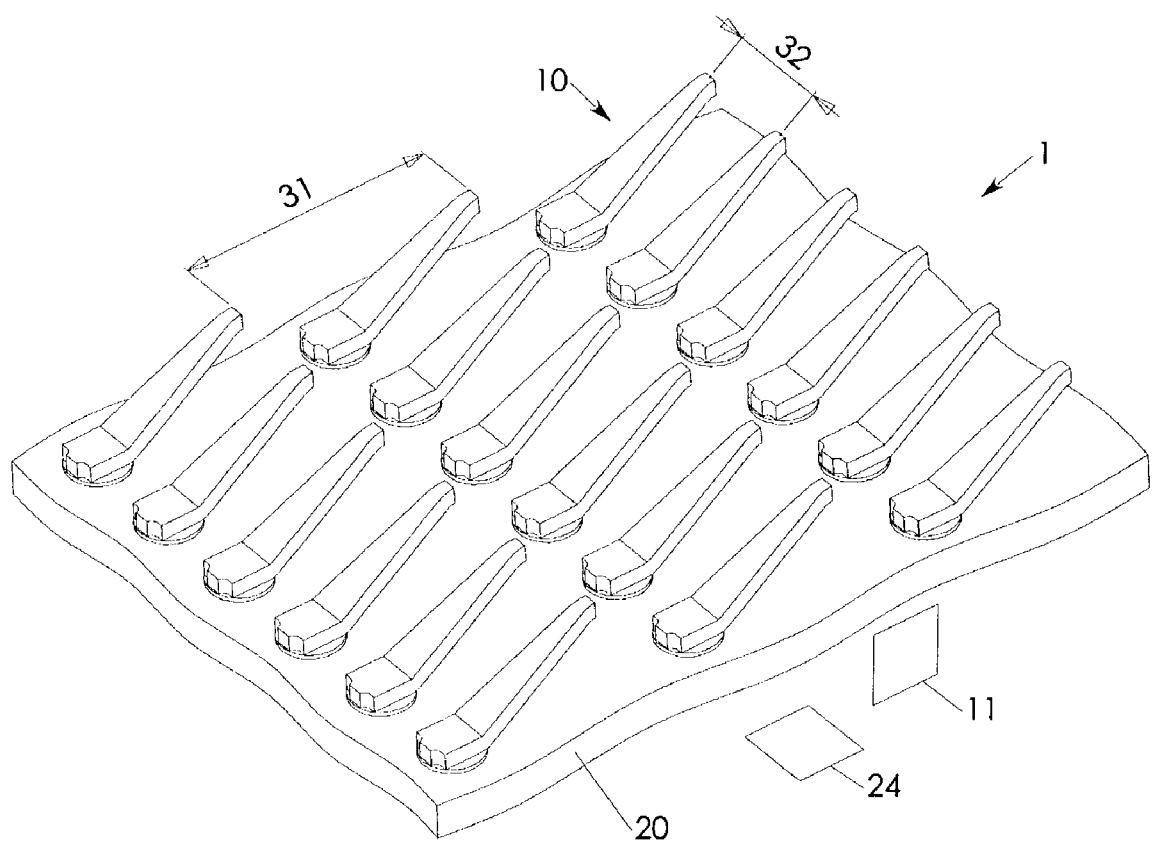
FIG. 7 shows the larger structure of FIG. 3 populated with interconnect structures of FIGS. 5 and 6 simultaneously attached to the terminals of the larger structure.

As shown in FIG. 7, a final interconnect assembly 1 according to the first configuration features interconnect structures 10 simultaneously attached to the terminals 22 with a spacing substantially equal to the fabrication spacing 31, 32.

Figure 8:
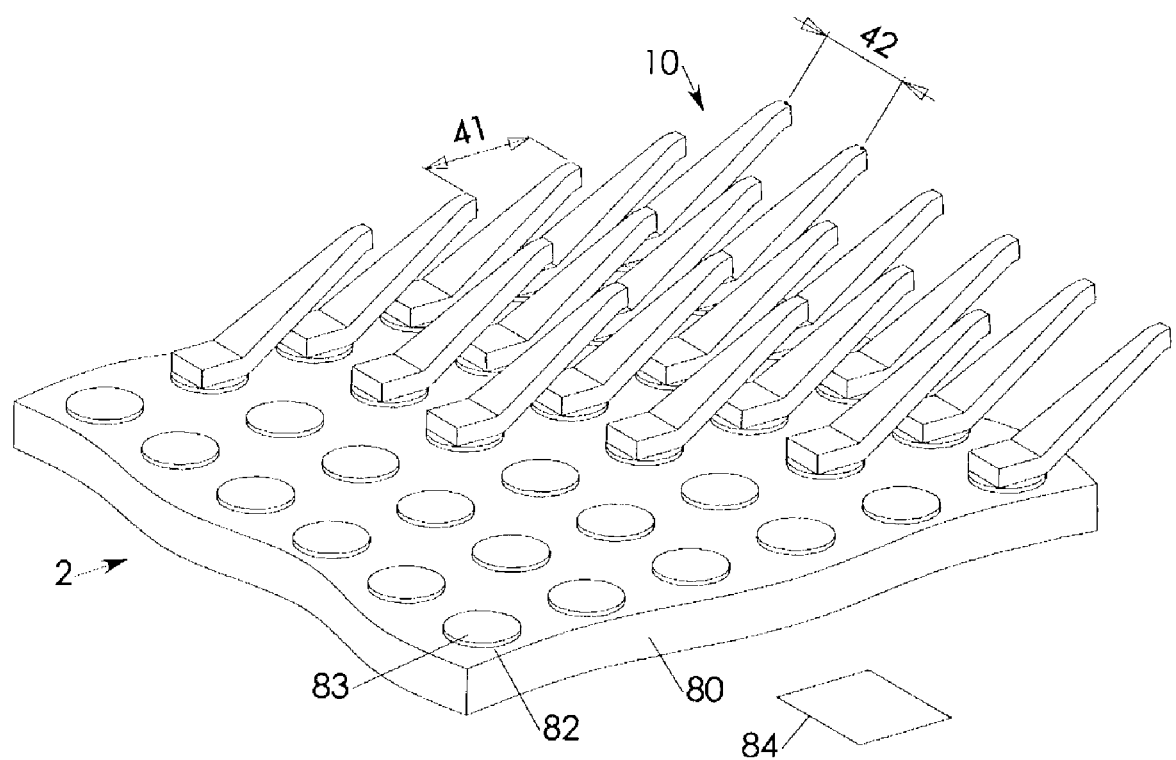
FIG. 8 illustrates an extended portion of the larger structure in a second configuration partially populated with a number of interconnect structures sequentially attached to some of the terminals of the larger structure.

FIGS. 8–12 show a second configuration of the interconnect assembly 2 and its fabrication steps in which the interconnect structures 10 are sequentially assembled with an assembly spacing 41, 42 that is substantially independent from fabrication spacing 31, 32. According to FIG. 8, a larger structure 80 has a number of attachment terminals 82 arrayed on the larger structure 80 with spacing 41, 42. A number of interconnect structures 10 are attached to the terminal faces 83. The interconnect assembly 2 is shown in FIG. 8 in an intermediate fabrication state to illustrate the differences to the interconnect assembly 1. A final interconnect assembly 2 may feature interconnect structures 10 attached to each of the attachment terminals 82.

Figure 9:
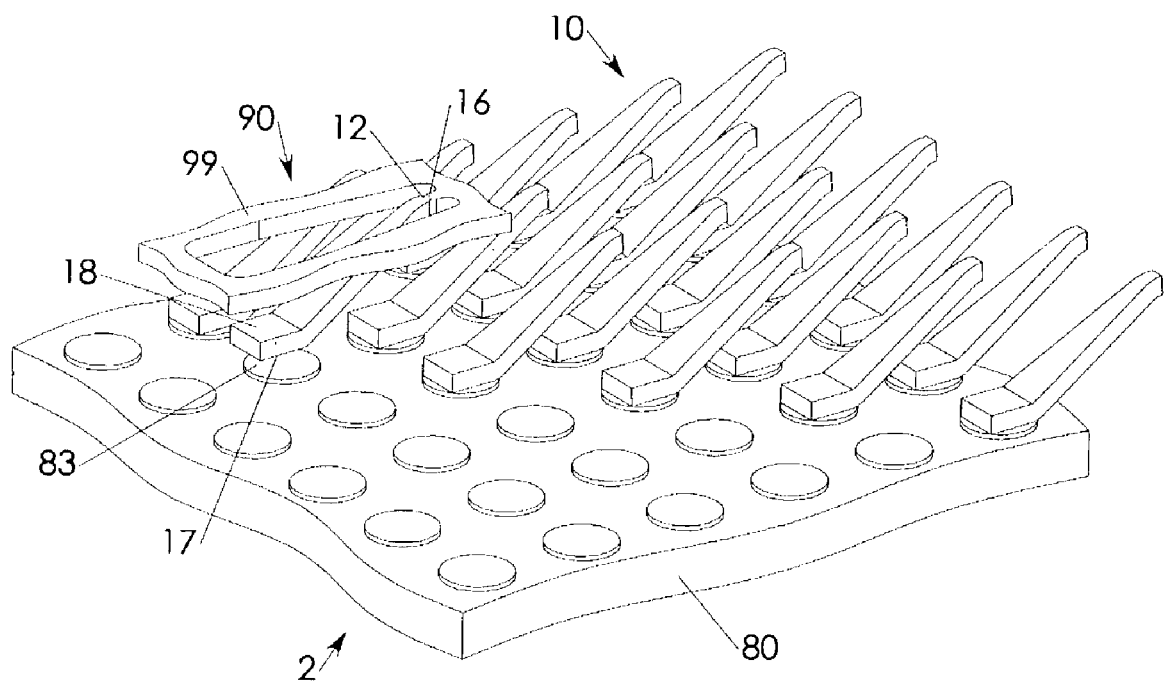
FIG. 9 depicts the larger structure of FIG. 8 with an additional interconnect structure held within a portion of a second carrier structure. The additional interconnect structure is positioned with its base in the vicinity of an unpopulated terminal for a following sequential attachment operation.

The sequential attachment is explained in the following for a single interconnect structure 10. FIG. 9 depicts a fabrication step in which an interconnect structure 90 is brought with its attachment face 17 into proximity of an unpopulated terminal face 83. The interconnect structure 90 is held within a second carrier structure 99 such that the positioning of the interconnect structure 90 is unimpeded by prior attached interconnect structures 10 that are already part of interconnect assembly 2. The fabrication position of the interconnect structure 90 within the second carrier structure 99 is defined in a fashion that takes into account the spatial limitation at the attachment position of the interconnect structure 90. This is an important fact for selecting the spacing 41, 42 and/or selecting an assembly orientation of the interconnect structures 10 independently from the fabrication spacing 31, 32 and independently from an eventual fabrication orientation of the interconnect structure 90 within the second carrier structure 99.

As shown in FIG. 9, the fabrication position of the interconnect structure 90 is selected such that the second carrier structure 99 remains sufficiently above the interconnect structures 10 while the attachment face 17 is brought into attachment position. To accomplish this, the cutoff bridge 16 holds the interconnect structure 90 at its contacting tip 12. As it may be appreciated by anyone skilled in the art, the cutoff bridge 16 may be placed at any location suitable for fabrication of the interconnect structure 10, 90 and for positioning the attachment face 17 with respect to the terminal face 23, 83.

Figure 10:
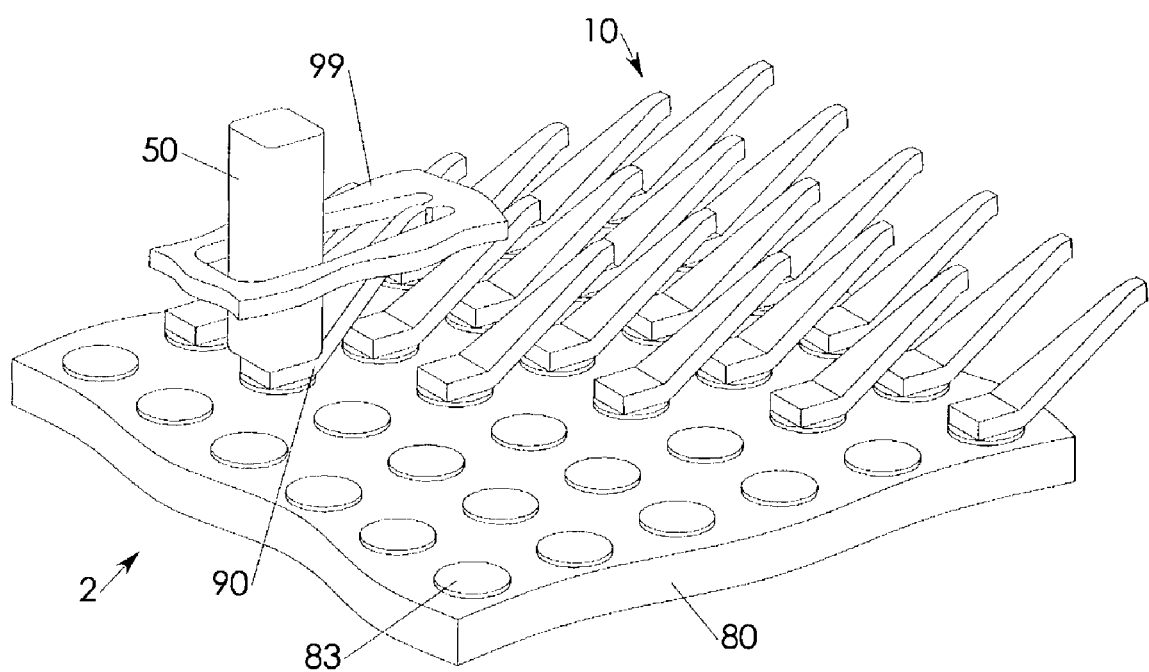
FIG. 10 shows the larger structure of FIG. 8 with the interconnect structure of FIG. 9 being attached to the unpopulated terminal of FIG. 9.
Figure 11:
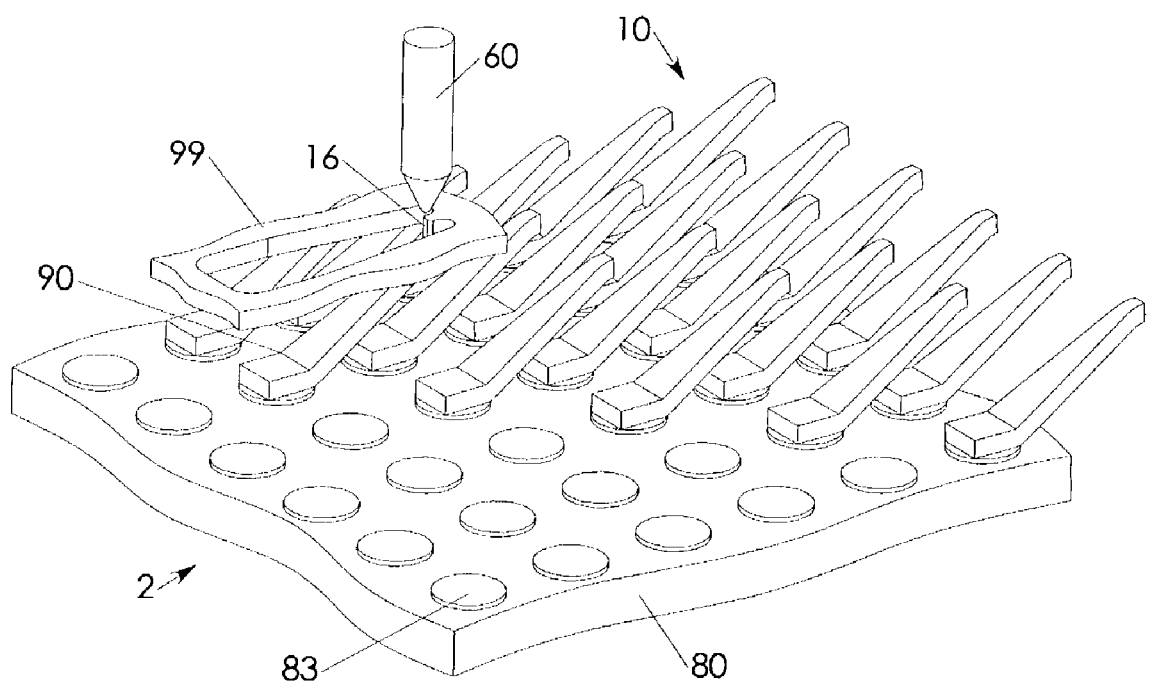
FIG. 11 illustrates the larger structure of FIG. 8 with the attached interconnect structure of FIG. 10 being cut off from the second carrier structure.

In a following step illustrated in FIG. 10, the interconnect structure 90 is attached to the unpopulated terminal 83 by the attachment tool 50 in a fashion similar as described for the interconnect assembly 1. The attachment tool 50 may also operate to push onto the access face 18 such that an eventual gap remaining after initial attachment positioning between the attachment face 18 and the terminal face 83 is closed. The resilience of the suspension element 13 may assist thereby to absorb for the resulting offset between the base 15 and the carrier structure 99.

Figure 12:
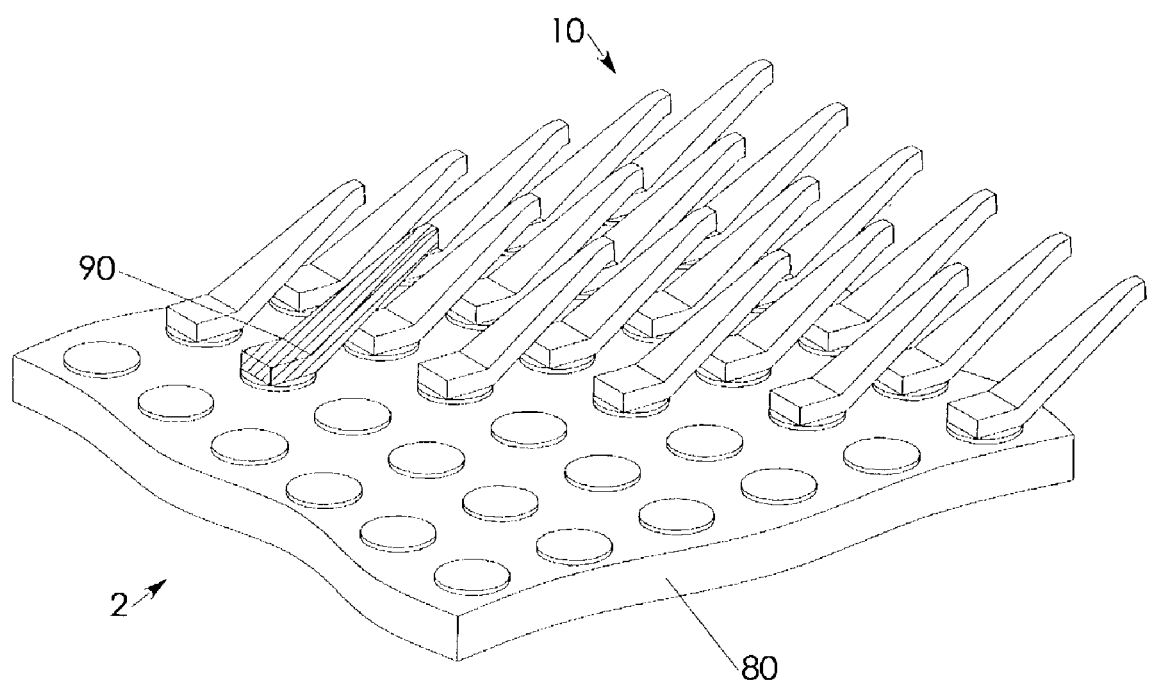
FIG. 12 shows the larger structure of FIG. 8 populated with the additional interconnect structure of FIG. 11.

After attachment, the interconnect structure 90 is separated by the cutoff tool 60 in a fashion similar to that explained for the interconnect assembly 1. In the case, where the attachment face 18 was forced into contact with the terminal face 83 by the attachment tool 50, the internal stress of the suspension element 13 is released as soon as the cutoff operation is completed. Consequently, the cutoff interconnect structure 90 bounces back into its original fabrication shape as is depicted in FIG. 12. For the purpose of visibility, the interconnect structure 90 is hatched in FIG. 12.

Whereas in the first configuration, the interconnect structures 10 are simultaneously attached, in the second configuration the interconnect structures 10 are sequentially attached. The teachings separately presented for the interconnect assembly 1, 2 may be combined in ways that are well appreciated by anyone skilled in the art. Hence, the scope of the invention includes embodiments in which sequential and parallel attachment may be combined to optimize the fabrication process in conjunction with particularities of the interconnect assembly 1, 2. For example, an interconnect assembly 1, 2 may feature a number of distinctly oriented and grouped interconnect structures 10 for contacting a single contact terminal 151, 162, with a number of contacting ends 12. In such a case, sequential attachment may be split into groups of equally oriented interconnect structures 10. A larger structure 20, 80 may be consequently populated by a sequential repetition of simultaneous attachment of groups of equally oriented interconnect structures 10.

Figure 13:
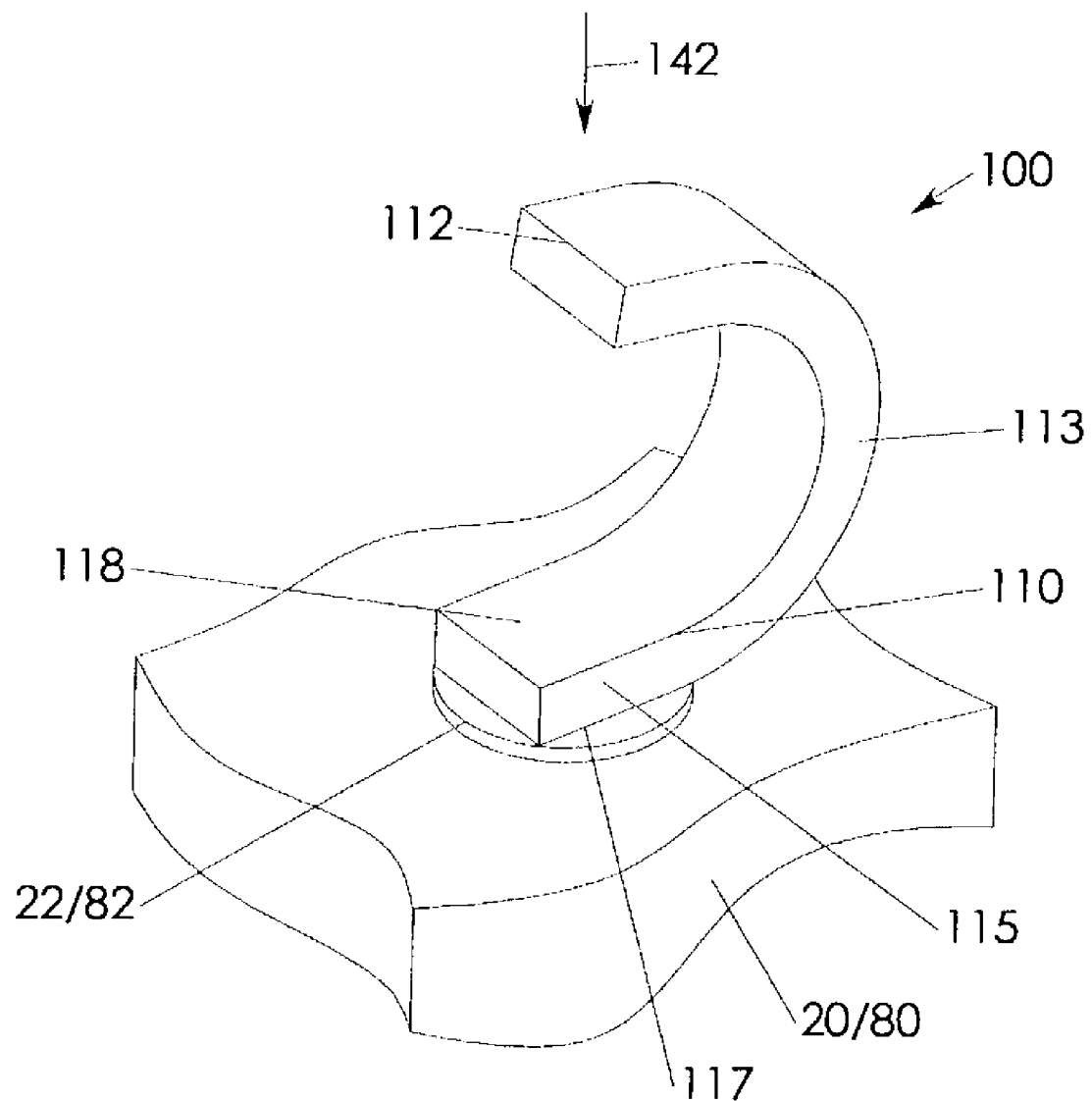
FIG. 13 depicts a perspective view of a second embodiment interconnect assembly with a portion of a larger structure.

FIG. 13 depicts another embodiment of an interconnect assembly, in which an interconnect structure 110 has a backwards looping suspension element 113 that positions the contacting end 112 substantially centrally together with the attachment face 117 in direction of the positioning movement 142. In that fashion, the attachment interface is kept substantially free of bending stress regardless of the spring force.

Figure 14:
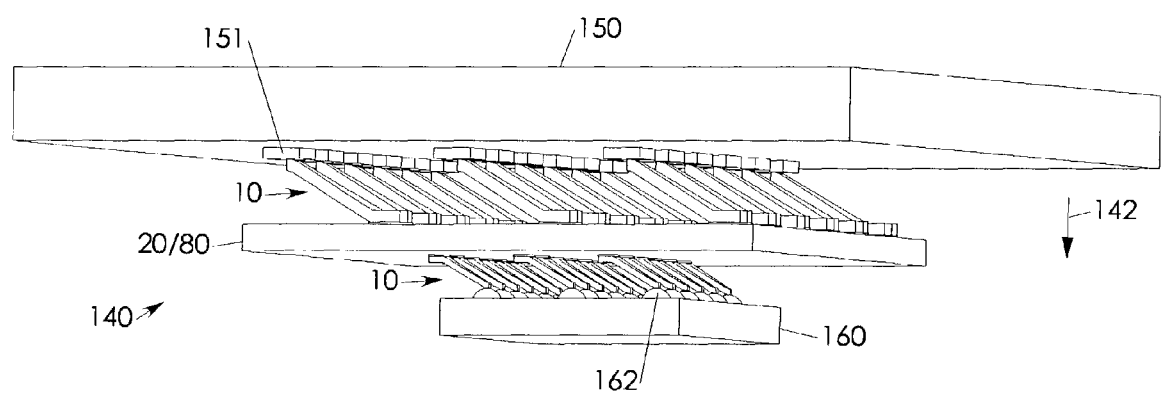
FIG. 14 illustrates a portion of a probe apparatus.

FIG. 14 illustrates a portion of a probe apparatus 140 in testing position after positioning movement 142 towards a tested circuit chip 160. The larger structure 20/80 is a well-known space transformer with interconnect structures 10 attached on top and bottom. The interconnect structures 10 that are attached on the bottom contact the test terminals 162 of the tested chip 160. The interconnect structures 10 attached on the top of the space transformer 20/80 are in contact with terminals 151 of a well-known printed circuit board [PCB] transformer 150. Nevertheless, interconnect structures 10 may also be attached to the PCB transformer contacting terminals (not shown) on the space transformer 20/80.

Carrier plates 19, 99 as well as interconnect structures 10, 100 are preferably fabricated from sheet metal. The sheet metal is preferably monolithic. In other embodiments, the raw material from which the interconnect structures 10, 110 are fabricated is a sandwiched compound material including a number of layers specifically configured for their final placement in one or more elements of the interconnect structure 10, 110. Layers may be selectively removed in well-known fabrication techniques.

The carrier structures 19, 99 are sacrificial and disposed of after attachment of the interconnect structures 10, 90, 100 to the attachment terminals 22, 82 and after completion of the cut off operation. The carrier structures 19, 99 may be configured as substantially finite elements containing a certain number of interconnect structures 10, 90, 100. The carrier structures 19, 99 may also be substantially infinite elements configured as a band continuously forwarded as interconnect structure(s) 10, 90, 100 are used up during the assembly procedure. The term "substantially finite" means in context with the present invention a limited area extension selected primarily for a feasible handling of a single carrier structure 19, 99 within and during the assembly process of the interconnect structures 10, 90, 100. The term "substantially infinite" means in context with the present invention a band like configuration in which the length of the band is limited primarily by feasibility of handling outside the assembly process as is well appreciated by anyone skilled in the art.

A first fabrication apparatus may prefabricate the interconnect structures 10, 90, 100 in a continuous fashion as is well known for progressive dies. Such fabrication apparatus may be combined with a second fabrication apparatus for positioning and metallurgical bonding the interconnect structures 10, 90, 100 as explained above. The second fabrication apparatus may be configured in a way similar to a well-known tape application bonding apparatus. For an infinite carrier structure, an interconnect assembly may be fabricated by merely providing a roll of sheet metal band on which the interconnect structures 10, 90, 100 are prefabricated immediately prior their final assembly. The infinite carrier structure progresses thereby through a number of prefabrication stages in a rate that corresponds to the rate with which the interconnect structures 10, 90, 100 are attached to the attachment terminals 22, 82.

Accordingly, the scope of the invention described in the specification above is set forth in the following claims and their legal equivalent:

What is claimed is:

1. An interconnect assembly for providing electrical interconnection for testing of semiconductor devices, said interconnect assembly comprising:
   a. a larger structure having a plurality of electrically conductive attachment terminals; and
   b. a plurality of interconnect structures, each of said interconnect structures being metallurgically bonded to a respective one of said attachment terminal wherein at least one of said interconnect structures is metallurgically bonded to a respective one of said attachment terminal such that a portion of said at least one interconnect structures extends above a portion of another of said interconnect structures, and said each interconnect structure having:
   I. an attachment base having:
      1. an attachment face for said metallurgical bonding to said attachment terminal; and
      2. an access face substantially opposing said attachment face for accessing said attachment base with an attachment tool;
   II. a suspension element protruding from said attachment base adjacent said attachment face and adjacent said access face such that said attachment of said attachment face via the attachment tool is substantially unimpeded by said suspension element; and
   III. a contacting end positioned at a distal end of said suspension element, said contacting end being configured for establishing conductive contact with a contact terminal while said contacting end is forced against said contact terminal, said contacting end being shaped to scribe against the contact terminal during contact therebetween, said contact terminal being configured to be in electrical contact with a semiconductor device to be tested;
   wherein said contacting end is configured to be forced into contact with the contact terminal by a positioning movement of said larger structure relative to said contact terminal.

2. The assembly of claim 1, wherein said interconnect structure is fabricated from sheet metal.

3. The assembly of claim 1, wherein said larger structure comprises at least one conductive lead conductively connected to said at least one attachment terminal for communicating an electric signal towards and/or away from said interconnect structure.

4. The assembly of claim 1, wherein said larger structure is a space transformer of a probe apparatus.

5. The assembly of claim 1, wherein said larger structure is a printed circuit board transformer of a probe apparatus.

6. The assembly of claim 1, wherein said suspension element is configured such that an internal bending stress that occurs along a length of said suspension element as a result from a spring force applied to said suspension element is substantially equal along a length of said suspension element, the spring force being generated by the positioning movement of the larger structure relative to the contact terminal.

7. The assembly of claim 1, wherein said attachment base, said suspension element and said contacting end are shaped parallel with respect to a contour plane.

8. The assembly of claim 7, wherein said contour plane is substantially perpendicular to an assembly plane of said larger structure.

9. The assembly of claim 1, wherein said suspension element is backwards looped.

10. The assembly of claim 9, wherein said suspension element is backwards looped such that said contacting end and said attachment face are substantially centered with respect to a direction of said spring force.

11. The assembly of claim 1, wherein a number of said interconnect structures are assembled and oriented in separate orientations on said larger structure such that said contacting ends are in a minimal distance to each other.

12. The assembly of claim 1, wherein said contacting end is configured to remove at least a portion of a layer from the contact terminal when said contacting end scribes against the contact terminal, and wherein a deformation characteristic of said suspension element results in said contacting end scribing against the contact terminal in response to said positioning movement.

13. The assembly of claim 1, wherein between said attachment face and a terminal face of said attachment terminal an attachment interface is defined in combination with a welding operation.

14. The assembly of claim 13, wherein said welding operation is a laser welding operation.

15. The assembly of claim 13, wherein said welding operation is a friction welding operation.

16. The assembly of claim 1, wherein between said attachment face and a terminal face of said attachment terminal an attachment interface is defined in combination with a friction welding operation.

17. The assembly of claim 1, wherein between said attachment face and a terminal face of said attachment terminal an attachment interface is defined in combination with a soldering operation.

18. The assembly of claim 1, wherein between said attachment face and a terminal face of said attachment terminal an attachment interface is defined in combination with a bracing operation.

19. A probe apparatus for providing electrical interconnection for testing of semiconductor devices, said probe apparatus comprising:
 a. a larger structure having a plurality of electrically conductive attachment terminals, and a plurality of conductive leads, each conductive lead being conductively connected to at least one attachment terminal for communicating an electric signal towards and/or away from said attachment terminal;
 b. a plurality of interconnect structures, each of said interconnect structures being metallurgically bonded to a respective one of said attachment terminals, wherein at least one of said interconnect structures is metallurgically bonded to a respective one of said attachment terminal such that a portion of said at least one interconnect structure extends above a portion of another of said interconnect structures, and said each interconnect structure having:
  I. an attachment base having:
   1. an attachment face for said metallurgical bonding to said attachment terminal;
   2. an access face substantially opposing said attachment face for accessing said attachment base with an attachment tool;
  II. a suspension element protruding from said attachment base adjacent said attachment face and adjacent said access face such that said attachment of said attachment face via the attachment tool is substantially unimpeded by said suspension element;
  III. a contacting end positioned at a distal end of said suspension element, said contacting end being configured for establishing conductive contact with a contact terminal while said contacting end is forced against said contact terminal, said contacting end being shaped to scribe against the contact terminal during contact therebetween, said contact terminal being configured to be in electrical contact with a semiconductor device to be tested;
wherein said contacting end is configured to be forced into contact with the contact terminal by a positioning movement of said probe apparatus relative to said contact terminal.

20. The probe apparatus of claim 19, wherein said interconnect structure is fabricated from sheet metal.

21. The probe apparatus of claim 19, wherein said larger structure is a space transformer.

22. The probe apparatus of claim 19, wherein said larger structure is a printed circuit board transformer.

23. The probe apparatus of claim 19, wherein said suspension element is configured such that an internal bending stress that occurs along a length of said suspension element as a result from a spring force applied to said suspension element is substantially equal along a length of said suspension element, the spring force being generated by the positioning movement of the larger structure relative to the contact terminal.

24. The probe apparatus of claim 19, wherein said attachment base, said suspension element and said contacting end are shaped parallel with respect to a contour plane.

25. The probe apparatus of claim 24, wherein said contour plane is substantially perpendicular to an assembly plane of said larger structure.

26. The probe apparatus of claim 19, wherein said suspension element is backwards looped.

27. The probe apparatus of claim 26, wherein said suspension element is backwards looped such that said contacting end and said attachment face are substantially centered with respect to a direction of said spring force.

28. The probe apparatus of claim 19, wherein a number of said interconnect structures are assembled and oriented in separate orientations on said larger structure such that said contacting ends are in a minimal distance to each other.

29. The probe apparatus of claim 19, wherein said contacting end is configured to remove at least a portion of a layer from the contact terminal when said contacting end scribes against the contact terminal, and wherein a deformation characteristic of said suspension element results in said contacting end scribing against the contact terminal in response to said positioning movement.

30. The probe apparatus of claim 19, wherein between said attachment face and a terminal face of said attachment terminal an attachment interface is defined in combination with a welding operation.

31. The probe apparatus of claim 30, wherein said welding operation is a laser welding operation.

32. The probe apparatus of claim 30, wherein said welding operation is a friction welding operation.

33. The probe apparatus of claim 19, wherein between said attachment face and a terminal face of said attachment terminal an attachment interface is defined in combination with a friction welding operation.

34. The probe apparatus of claim 19, wherein between said attachment face and a terminal face of said attachment terminal an attachment interface is defined in combination with a soldering operation.

35. The probe apparatus of claim 19, wherein between said attachment face and a terminal face of said attachment terminal an attachment interface is defined in combination with a bracing operation.

* * * * *